United States Patent [19]
Giolma

[11] Patent Number: 5,384,746
[45] Date of Patent: Jan. 24, 1995

[54] CIRCUIT AND METHOD FOR STORING AND RETRIEVING DATA

[75] Inventor: William H. Giolma, Dallas, Tex.

[73] Assignee: Texas Instruments Incorporated, Dallas, Tex.

[21] Appl. No.: 188,177

[22] Filed: Jan. 28, 1994

[51] Int. Cl.⁶ .................. G11C 11/00; G11C 17/00
[52] U.S. Cl. ......................... 365/225.7; 365/96
[58] Field of Search ............. 365/225.7, 210, 201, 365/96; 307/202.1; 324/550

[56] References Cited

U.S. PATENT DOCUMENTS

| | | | |
|---|---|---|---|
| 4,592,025 | 5/1986 | Takemae et al. | 365/96 |
| 4,707,806 | 11/1987 | Takemae et al. | 365/96 |
| 5,258,953 | 11/1993 | Tsujimoto | 365/225.7 |
| 5,291,139 | 3/1994 | Fruhauf et al. | 324/550 |
| 5,293,339 | 3/1994 | Suzuki et al. | 365/225.7 |
| 5,319,592 | 6/1994 | Neusen | 365/96 |

*Primary Examiner*—Eugene R. LaRoche
*Assistant Examiner*—Tan Nguyen
*Attorney, Agent, or Firm*—W. James Brady, III; Richard L. Donaldson

[57] ABSTRACT

A circuit (10) for storing and retrieving data is provided. Circuit (10) stores data on a data fuse (20). The values of the stored data may be established by comparing the data fuse (28) with a test fuse (22) using a storage and sensing circuit (12). The value of the data fuse (20) may be set by a fuse setting circuit (14). Additionally, a value may be substituted for the data fuse (20) using a flip flop (16) and an output logic circuit (18).

20 Claims, 1 Drawing Sheet

CIRCUIT AND METHOD FOR STORING AND RETRIEVING DATA

TECHNICAL FIELD OF THE INVENTION

This invention relates in general to the field of electronic devices. More particularly, this invention relates to a circuit and method for storing and retrieving data.

BACKGROUND OF THE INVENTION

Many electronic systems combine analog and digital technology. In such systems, the analog portion may require a current, voltage or capacitance that is equal to some absolute value. A predetermined, digital value may be used to control a circuit that trims the current, voltage or capacitance.

Existing systems and methods for storing trimming values have used a fuse to generate a logic value. A fuse may comprise polysilicon doped to render it conductive or a metal link. Each fuse may represent a single bit of data. If the fuse is blown, then the fuse may represent a high logic value. If, however, the fuse not blown, the fuse may represent a low logic value. During production of an integrated circuit device, a plurality of fuses may be set to form a predetermined digital value for use in trimming an analog signal. Existing systems and methods use sensing circuits to determine whether each fuse is blown or not blown. However, existing systems and methods exhibit several problems in implementing the fuse technology.

Unlike a discrete fuse, after an integrated circuit fuse has blown, a portion of the fuse may grow back. Effectively, this erases the stored value because sensing circuits in existing systems and method may be unable to distinguish between a fuse that has some grow back and a fuse that has not been blown. Additionally, existing systems and methods do not provide for updating the value of a fuse once it is set in a circuit. Therefore, a new trimming value may not be introduced into a circuit once it has been fabricated.

SUMMARY OF THE INVENTION

In accordance with the present invention, a circuit and method for storing data is provided which substantially eliminates or reduced disadvantages and problems associated with prior systems and methods. More particularly, an embodiment of the present invention provides a circuit for storing data having a data fuse and a test fuse. The data fuse may store a data value represented by a state of the data fuse. The data value may be determined by comparing the state of the data fuse with the state of the test fuse. The circuit uses first and second current mirrors to compare the test fuse with the data fuse. The first current mirror is coupled to both the data and test fuses and establishes a current in each of the fuses. The second current mirror comprises two transistors that are coupled to the first current mirror. The current through the data fuse is provided to the first transistor of the second current mirror. The second transistor is sized in a predetermined ratio with the first transistor such that the output of the second current mirror provides a predetermined voltage if the data fuse is blown. Furthermore, the output of the second current mirror provides a second predetermined voltage if the data fuse is not blown.

A technical advantage of the present invention inheres in the fact that it prevents a false reading of a data fuse. The circuit of the present invention prevents false readings even if a blown fuse has partially regrown. Typically the blown fuse will not grow back completely. Therefore, there should be a difference between a blown fuse and a non-blown fuse. The circuit of the present invention is able to sense this difference even if the blown fuse is partially regrown.

Another technical advantage of the present invention inheres in the fact that the data fuse may only be blown during production of an integrated circuit component. The circuit of the present invention incorporates a circuit for establishing the state of the data fuse. This circuit includes a pad that is brought to a ground potential to blow the data fuse. Once the state of the data fuse is set, this pad is buried so that it may not be set to a ground potential subsequent to production of the integrated circuit component.

Another technical advantage of the present invention inheres in the fact that the state of a plurality of fuses may be established using a single pulse. The circuit used to establish the state of the fuse incorporates a node that is brought to a ground potential in order to blow the fuse. A plurality of data cells constructed according to the teachings of the present invention may be coupled in parallel at this node. A single pad may be coupled to these nodes. A pulse having a predetermined width may be applied to this node so as to establish the appropriate state for each of the data fuses in the circuit. An individual control signal may be provided to the data setting circuit for each of the individual cells. Thereby, when the common pad is brought to a ground potential each of the fuses is set to the appropriate state.

Another technical advantage of the present invention inheres in the fact that a different data value may be substituted for the data stored in the data fuse. The circuit incorporates a flip flop that is coupled to a series of logic gates. The logic gates may select between the value of the data fuse and the value of the flip flop based on a fuse select signal from an external system. The external system may read the value of the fuse before determining whether to replace the stored data.

Another technical advantage of the present invention inheres in the fact that the circuit for establishing the state of the data fuse incorporates a bipolar junction transistor. The use of a bipolar junction transistor allows generation of sufficient current to blow a fuse. Additionally, the bipolar junction transistor may be fabricated in a smaller surface area than a MOSFET transistor.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
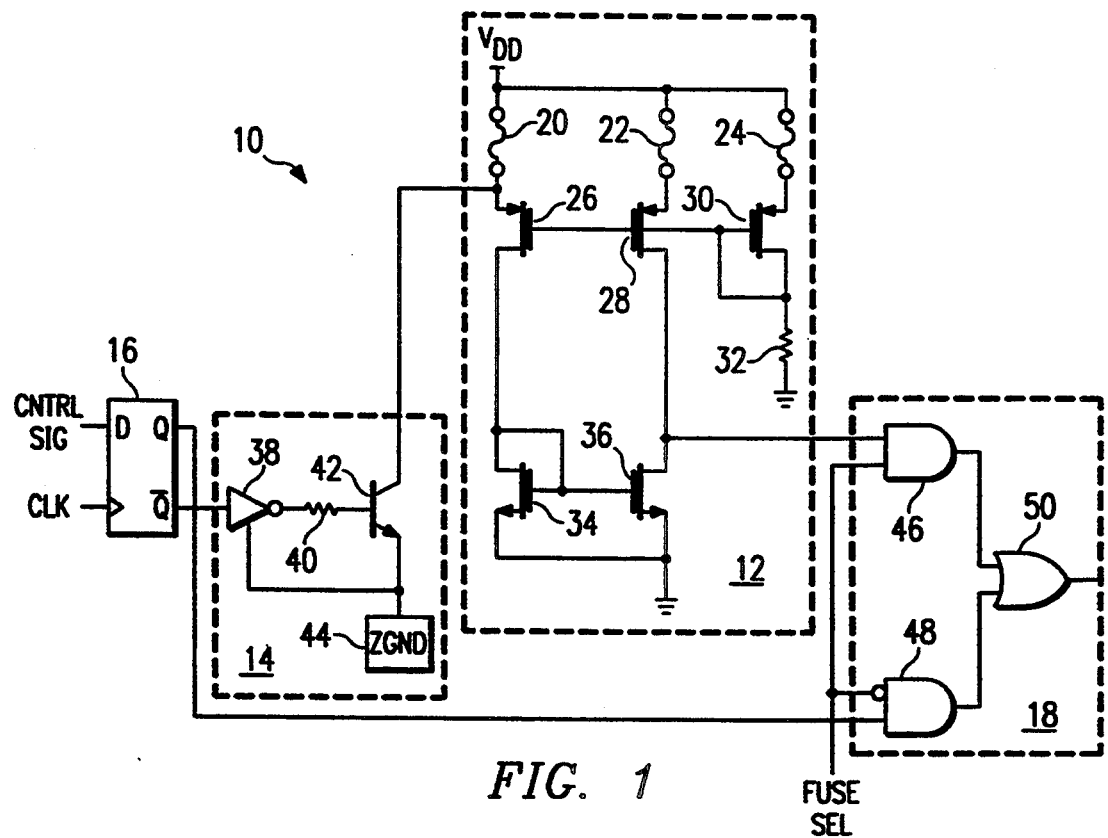
FIG. 1 illustrates a circuit for storing and retrieving data constructed according to the teaching of the present invention.

FIG. 1 illustrates a circuit for storing and retrieving data indicated generally at 10 and constructed according to the teaching of the present invention. System 10 stores data using a fuse. For example, if the fuse is blown, the output of circuit 10 may comprise, for example, a high logic value. If, however, the fuse is not blown, the output of circuit 10 may comprise, for example, a low logic value. Alternatively, a high logic value may correspond to a non-blown fuse and a low logic value may correspond to a blown fuse. The state of a fuse in circuit 10 may be set during production of a chip incorporating circuit 10. Therefore, circuit 10 may be considered a non-volatile memory system. Circuit 10 may be used in an electronic device for trimming an analog signal. Alternatively, circuit 10 may be used as a memory cell in an analog or digital system. Circuit 10 comprises a storage and sensing circuit 12, a fuse setting circuit 14, a flip flop 16 and an output logic circuit 18.

Circuit 10 stores data and determines the value of that data in storage and sensing circuit 12. Storage and sensing circuit 12 may comprise three fuses, data fuse 20, test fuse 22, and current mirror fuse 24. Each of fuses 20, 22 and 24 are coupled between a power supply and a source of first, second and third transistors 26, 28 and 30, respectively. Fuses, 20, 22, and 24 may comprise, for example, polysilicon doped to render it conductive or an appropriate metal link. Each of fuses, 20, 22, and 24 may be fabricated so as to enter a blown state when a predetermined current passes through the fuse. Transistors 26, 28, and 30 may comprise, for example, P-Channel MOSFET transistors or other appropriate transistors for use in a current mirror. Transistors 26, 28, and 30 may be approximately equal in size so as to provide approximately equal current through fuses 20, 22 and 24. Alternatively, transistors 26, 28, and 30 may be sized to create an appropriate ratio of currents through fuses 20, 22 and 24. A gate of each of transistors 26, 28 and 30 are coupled together to form a single node. A drain of transistor 30 is coupled to the gate of transistor 30. Finally, a resistor 32 is coupled between the drain of transistor 30 and a ground potential. The configuration of transistors 26, 28 and 30, and resistor 32 comprise a current mirror. Transistor 30 and resistor 32 establish a current for the current mirror. This current may be replicated in transistors 26 and 28.

Storage and sensing circuit 12 additionally comprises transistors 34 and 36 coupled to form a second current mirror. Transistors 34 and 36 may comprise, for example, N-Channel MOSFET transistors. A drain of transistor 34 may be coupled to a drain of transistor 26. A drain of transistor 36 may be coupled to a drain of transistor 28. A source of each of transistors 34 and 36 may be coupled to a ground potential. A gate of transistor 36 may be coupled to a gate of transistor 34. Finally, the gate of transistor 34 may be coupled to a drain of transistor 34. In this manner, transistor 34 and transistor 36 comprise a second current mirror.

Transistor 36 may be sized to be, for example, twice the size of transistor 34. Therefore, transistor 36 will conduct approximately double the current of transistor 34. The output of storage and sensing circuit 12 may comprise the voltage at the drain of transistor 36.

In operation, the voltage at the drain of transistor 36 will indicate whether data fuse 20 was blown during production. If data fuse 20 was not blown, the current through transistor 26 will be approximately equal to the current through transistor 28. Additionally, the current through transistor 26 will be approximately equal to the current through transistor 34. Because transistor 36 is sized to be twice the size of transistor 34, the current through transistor 36 will be approximately double the current through transistor 34. Therefore, the voltage at the drain of transistor 36 is brought to a low logic value because transistor 28 may not supply enough current to transistor 36.

If data fuse 20 has been blown during production, data fuse 20 will appear to be approximately an open circuit. Therefore, the current through transistors 26 and 34 will be substantially reduced. Additionally, the current through transistor 36 will be proportionately reduced. In this situation, the current through transistor 28 will be able to overcome the current of transistor 36 and charge the drain of transistor 36 up to a high logic value.

The ratio of the sizes of transistors 36 and 34 may be adjusted to compensate for the worst case of expected grow back in a blown data fuse 20. If data fuse 20 does grow back slightly, the current through transistor 26 and 34 will be increased proportionately. Therefore it will be more difficult for the current of transistor 28 to overcome the current of transistor 36. However, one of ordinary skill in the art would be able to adjust the ratio of transistor 36 to transistor 34 such that storage and sensing circuit 12 will produce an appropriate output in the worse case grow back for data fuse 20.

Fuse setting circuit 14 may be used to establish a value for data fuse 20 during production of a semiconductor device. Fuse setting circuit 14 may comprise, for example, an inverter 38, a resistor 40, a transistor 42, and a pad 44. Inverter 38 may comprise, for example, an approximate CMOS inverter or other approximate inverter. Additionally, transistor 42 may comprise, for example, an NPN bipolar junction transistor or other appropriate transistor for generating current through data fuse 20.

Inverter 38 is coupled to receive a control signal from, for example, flip-flop 16, indicating the desired state of data fuse 20. Inverter 38 is coupled to the base of transistor 42 through a resistor 40. A collector of transistor 42 is coupled to a node with fuse 20 and transistor 26. Finally, an emitter of transistor 42 is coupled to pad 44. The value of resistor 40 is chosen so as to provide sufficient base current for transistor 42 to blow data fuse 20.

In operation, fuse setting circuit 14 may establish a state for data fuse 20. If data fuse 20 is to be blown, a low logic value is provided to inverter 38. Additionally, pad 44 is brought to a ground potential. Therefore, resistor 40 provides current to the base of transistor 42 and causes transistor 42 to conduct current from the collector through the emitter to pad 44. Transistor 42 is sized to draw sufficient current through data fuse 20 such that data fuse 20 may be blown sufficient to cause a separation in the polysilicon or metal link of fuse 20. Once data fuse 20 has been blown, pad 44 may be allowed to float such that transistor 42 will not conduct.

Pad 44 of fuse setting circuit 14 adds several features to the system of the present invention. First, pad 44 may be buried subsequent to setting a value in data fuse 20. Therefore, the state of data fuse 20 may not be changed subsequent to production of a semiconductor device incorporating one or more systems 10. Additionally, a single pad 44 may be coupled to an emitter of transistor 42 of a plurality of fuse setting circuits 14. Therefore, a plurality of data fuses 20 may be blown simultaneously. Finally, pad 44 may be used to control the timing of establishing the state of data fuse 20. For example, a constant low logic value may be applied to inverter 38.

A pulse having a predetermined width may be applied to pad 44 such that pad 44 is brought to a ground potential during the pulse. In this manner, the time during which current is allowed to flow through data fuse 20 is controlled by pad 44. This may prevent over blowing data fuse 20 and destroying circuit 12.

Storage and sensing circuitry 12 may be characterized as a read only memory due to the non-volatile nature of the data stored on data fuse 20. However, the addition of flip flop 16 and output logic circuit 18 allow circuit 10 to store and provide volatile data as well. An external system (not shown) may read the value of data fuse 20. Based on that value, the external system may decide whether to replace the value stored on data fuse 20 with a different value.

Output logic circuit 18 establishes the output of circuit 10. Output logic circuit 18 may comprise, for example, first and second AND gates 46 and 48 and OR gate 50. The output of storage and sensing circuit 12 may be provided to first AND gate 46. Additionally, the output of flip flop 16 may be provided to AND gate 48. A fuse select signal is also coupled to an input of AND gate 46. The inverted value of the fuse select signal is also provided to a second input of AND gate 48. The output of each AND gate is coupled to an OR gate 50. The output of OR gate 50 comprises the output of circuit 10.

In operation, the output of circuit 10 may comprise the value stored in data fuse 20 or a value provided by flip flop 16. If the fuse select signal is set to a high logic value, AND gate 48 will provide a low logic value to OR gate 50. Additionally, AND gate 46 will provide the value of data fuse 20 to OR gate 50. Therefore, the output of OR gate 50 will comprise the value of data fuse 20. Alternatively, if fuse select signal is set to a low logic value the output of AND gate 46 will comprise a low logic value. Additionally, the output of AND gate 48 will comprise the value from flip flop 16. Therefore, the output of OR gate 50 will comprise the output of flip-flop 16. The fuse select signal may be provided by a standard register. Finally, the control signal input of flip flop 16 may be provided from an external system (not shown).

Figure 2:
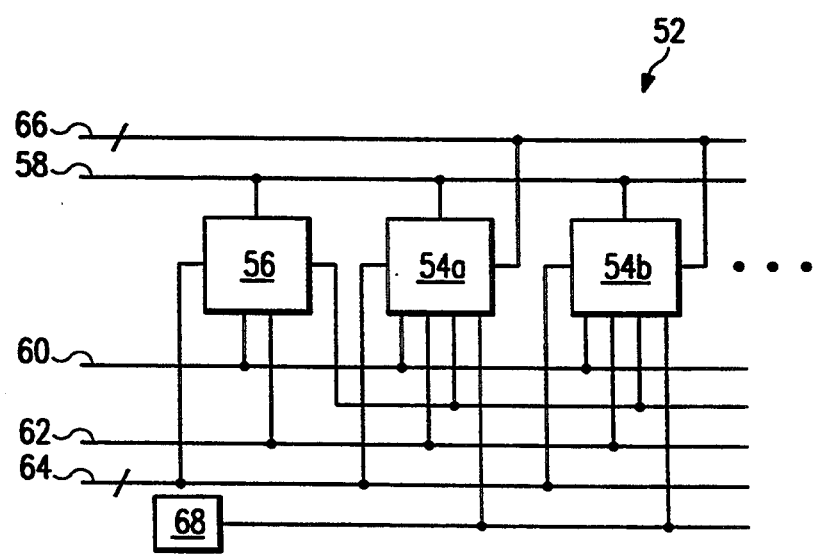
FIG. 2 illustrates a register incorporating a plurality of data storage and retrieval circuit of FIG. 1 constructed according to the teachings of the present invention.

FIG. 2 illustrates a register indicated generally at 52 incorporating a plurality of data cells. The data cells of register 52 may comprise, for example, fuse cells 54a and 54b constructed in a manner similar to circuit 10 for storing and retrieving data of FIG. 1. Register 52 may comprise an appropriate number of fuse cells 54 as required for a specific application. Additionally, register 52 may comprise a standard bit cell 56 for storing a fuse select bit. An output of cell 56 may be coupled to a fuse select input for each of fuse cells 54a and 54b. Therefore, the value of cell 56 may be used to control an output logic circuit 18 of each of fuse cells 54a and 54b.

Cell 56 and fuse cells 54a and 54b are each coupled to a positive power supply 58, a negative power supply 60 a clear signal 62 and an input data bus 64. Input data bus 64 may comprise, for example, a single line for each cell of register 52. Positive power supply 58 and negative power supply 60 supply appropriate power for cell 56 and fuse cells 54a and 54b. Additionally, the value of cell 56 and fuse cells 54a and 54b may be cleared by a signal from clear line 62. Data may be read out of fuse cells 54a and 54b by an output bus 66. Output bus 66 comprises one line for each fuse cell in register 52. Finally, the value of each fuse cell 54a and 54b may be established during manufacture of an integrated circuit using pad 68. Pad 68 is coupled to pad 44 in each of fuse cells 54a and 54b.

In operation, the value of each fuse in register 52 may be established using pad 68. Additionally, the value stored in fuse cells 54a and 54b may be replaced by a value received on input bus line 64. Finally, data may be read out register 52 on output bus 66. The data stored in register 52 may be used, for example, to trim an analog signal. For example, output bus 66 may be coupled to provide digital data to a circuit (not shown) that uses the digital data to alter, for example, a current, a voltage, a capacitance, or a resistance value. Additionally, it is noted that data may be written to and read from register 52 in a serial manner thereby reducing the number of required pins.

Although the present invention has been described in detail, it should be understood that various changes, substitutions and alternations can be made hereto without departing from the spirit and scope of the invention as defined by the appended claims. For example, flip flop 16 and output logic circuit 18 may be removed such that circuit 10 may not be modified once the state of data fuse 20 is established. Additionally, pad 44 may be coupled to a pin of an integrated circuit so that the value of a non-blown data fuse may be modified even after the semiconductor device is completely fabricated. Furthermore, the number of fuse cells 54 in register 52 may be varied as needed for a particular application. Furthermore, a person of ordinary skill in the art may modify the circuit of FIG. 1 such that data is stored and read from fuse 22 rather than fuse 20. Finally, each of cells 54 may be biased by a single current generating circuit coupled to the gate of transistors 26 and 28. Such a circuit may comprise a circuit similar to transistor 30, resistor 32 and fuse 24 of FIG. 1.

What is claimed is:

1. A circuit for storing and retrieving data, comprising:
   a data fuse for storing a data value represented by a state of the data fuse;
   a test fuse for comparing with said data fuse;
   a first current mirror coupled to said data and test fuses and operable to establish a current in each of said data and test fuses;
   a second current mirror comprising first and second transistors coupled to said first current mirror for comparing said data fuse with said test fuse, wherein current from said data fuse is provided to said first transistor for establishing a current in said second transistor, an output of said second current mirror operable to receive current from said test fuse, said transistors sized in a predetermined ratio such that said output of said second current mirror provides a first predetermined voltage value if said data fuse is in a first predetermined state and said output provides a second predetermined voltage value if said data fuse is in a second predetermined state.

2. The circuit of claim 1, and further comprising circuitry for setting a state of said data fuse.

3. The circuit of claim 1, and further comprising circuitry for setting a state of said data fuse, comprising:
   a transistor having a base, a collector and an emitter, said collector coupled to said data fuse;
   circuitry coupled to said base of said transistor for developing base current in response to a control signal;

a pad coupled to said emitter such that said transistor is operable to conduct current when said pad is brought to a predetermined potential so as to establish said state of said data fuse.

4. The circuit of claim 1, and further comprising:
a flip-flop operable to receive replacement data; and
circuitry for selecting an output value from data stored in said data fuse and said replacement data.

5. The circuit of claim 1, wherein said transistors of said second current mirror comprise N-Channel MOSFET transistors and said second transistor is approximately twice the size of said first transistor.

6. The circuit of claim 1, wherein said first current mirror comprises:
first, second and third P-Channel transistors, each having a gate, a source and a drain;
a current mirror fuse;
a resistor;
said source of said first transistor is coupled to said data fuse, said drain coupled to a drain of said first transistor of said second current mirror, and said gate coupled to said gate of each of said second and third transistors;
said source of said second transistor coupled to said test fuse, said drain coupled to a drain of said second transistor of said second current mirror; and
said source of said third transistor coupled to said current mirror fuse, and said drain coupled to said resistor such that a current is established in each of said fuses of said first current mirror.

7. The circuit of claim 1, wherein said first current mirror comprises:
first and second transistors, each having a gate, a source and a drain;
circuitry for providing a bias current for said first current mirror;
said source of said first transistor coupled to said data fuse, said drain coupled to a drain of said first transistor of said second current mirror, and said gate coupled to said gate of said second transistor;
said source of said second transistor coupled to said test fuse, said drain coupled to a drain of said second transistor of said second current mirror; and
said gate of each of said first and second transistors coupled to said bias current circuitry such that a current is established in each of said fuses of said first current mirror.

8. A register, comprising:
an input data bus;
an output data bus; and
a plurality of data cells coupled to said input and output data busses, each data cell comprising:
a data fuse for storing a data value represented by a state of the data fuse;
a test fuse for comparing with said data fuse;
a first current mirror coupled to said data and test fuses and operable to establish a current in each of said data and test fuses;
a second current mirror comprising first and second transistors coupled to said first current mirror for comparing said data fuse with said test fuse, wherein current from said data fuse is provided to said first transistor for establishing a current in said second transistor, an output of said second current mirror operable to receive current from said test fuse, said transistors sized in a predetermined ratio such that said output of said second current mirror provides a first predetermined voltage value if said data fuse is in a first predetermined state and said output provides a second predetermined voltage value if said data fuse is in a second predetermined state;
a flip-flop operable to receive replacement data from said input bus; and
circuitry for selecting an output value from data stored in said data fuse and said replacement data to be provided to said output data bus.

9. The register of claim 8, and each said data cell further comprising circuitry for setting a state of said data fuse.

10. The register of claim 8, and each said data cell further comprising circuitry for setting a state of said data fuse, comprising:
a transistor having a base, a collector and an emitter, said collector coupled to said data fuse;
circuitry coupled to said base of said transistor for developing base current in response to a control signal;
a pad coupled to said emitter such that said transistor is operable to conduct current when said pad is brought to a predetermined potential so as to establish said state of said data fuse.

11. The register of claim 8, wherein said transistors of said second current mirror comprise N-Channel MOSFET transistors and said second transistor is approximately twice the size of said first transistor.

12. The register of claim 8, wherein said first current mirror comprises:
first, second and third P-Channel transistors, each having a gate, a source and a drain;
a current mirror fuse;
a resistor;
said source of said first transistor is coupled to said data fuse, said drain coupled to a drain of said first transistor of said second current mirror, and said gate coupled to said gate of each of said second and third transistors;
said source of said second transistor coupled to said test fuse, said drain coupled to a drain of said second transistor of said second current mirror; and
said source of said third transistor coupled to said current mirror fuse, and said drain coupled to said resistor such that a current is established in each of said fuses of said first current mirror.

13. The register of claim 8, wherein said first current mirror comprises:
first and second transistors, each having a gate, a source and a drain;
circuitry for providing a bias current for said first current mirror;
said source of said first transistor coupled to said data fuse, said drain coupled to a drain of said first transistor of said second current mirror, and said gate coupled to said gate of said second transistor;
said source of said second transistor coupled to said test fuse, said drain coupled to a drain of said second transistor of said second current mirror; and
said gate of each of said first and second transistors coupled to said bias current circuitry such that a current is established in each of said fuses of said first current mirror.

14. The register of claim 8, and each said data cell further comprising circuitry for setting a state of said data fuse, comprising:
a transistor having a base, a collector and an emitter, said collector coupled to said data fuse;

circuitry coupled to said base of said transistor for developing base current in response to a control signal;

a pad coupled to said emitter such that said transistor is operable to conduct current when said pad is brought to a predetermined potential so as to establish said state of said data fuse wherein said pad of each data cell is coupled to a single common node such that each data fuse may be simultaneously set.

15. The register of claim 8, and further comprising a clear line coupled to each said data cell to clear the value of said flip flop.

16. A method for storing and retrieving data, comprising the steps of:

establishing a current in a data fuse and a test fuse using a first current mirror;

comparing the state of the data fuse with the state of the test fuse in a second current mirror comprising first and second transistors coupled to the first current mirror wherein current from the data fuse is provided to the first transistor for establishing a current in the second transistor, an output of the second current mirror operable to receive current from the test fuse, the transistors sized in a predetermined ratio;

generating a first predetermined output voltage at the output of the second current mirror if the data fuse is in a first predetermined state; and generating a second predetermined output voltage at the output of the second current mirror if the data fuse is in a second predetermined state.

17. The method of claim 16, and further comprising the step of setting a state of a data fuse to represent a predetermined data value.

18. The method of claim 16, and further comprising the step of setting a state of a data fuse to represent a predetermined data value, comprising the steps of:

applying a first predetermined voltage to a resister coupled to a base of a transistor; and applying a second predetermined voltage to an emitter of the transistor such that the transistor is operable to establish a predetermined current in the data fuse.

19. The method of claim 16, and further comprising the steps of:

receiving replacement data at a flip-flop; and selecting an output value from data stored in the data fuse and the replacement data.

20. The method of claim 16, and further comprising the step of providing the output voltage to trim an analog signal.

* * * * *